United States Patent
Hytha et al.

(10) Patent No.: US 11,810,784 B2
(45) Date of Patent: *Nov. 7, 2023

(54) METHOD FOR MAKING SEMICONDUCTOR DEVICE INCLUDING A SUPERLATTICE AND ENRICHED SILICON 28 EPITAXIAL LAYER

(71) Applicant: Atomera Incorporated, Los Gatos, CA (US)

(72) Inventors: Marek Hytha, Brookline, MA (US); Keith Doran Weeks, Chandler, AZ (US); Nyles Wynn Cody, Tempe, AZ (US); Hideki Takeuchi, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 228 days.

This patent is subject to a terminal disclaimer.

(21) Appl. No.: 17/236,289

(22) Filed: Apr. 21, 2021

(65) Prior Publication Data
US 2022/0344155 A1 Oct. 27, 2022

(51) Int. Cl.
*H01L 21/02* (2006.01)
*H01L 21/8234* (2006.01)

(52) U.S. Cl.
CPC .. *H01L 21/02507* (2013.01); *H01L 21/02532* (2013.01); *H01L 21/02598* (2013.01); *H01L 21/8234* (2013.01)

(58) Field of Classification Search
None
See application file for complete search history.

(56) References Cited

U.S. PATENT DOCUMENTS 4,937,204 A 6/1990 Ishibashi et al.
5,216,262 A 6/1993 Tsu
(Continued)

FOREIGN PATENT DOCUMENTS

EP 0838093 10/2003
GB 2347520 6/2000
(Continued)

OTHER PUBLICATIONS

Xu et al., "MOSFET performance and scalability enhancement by insertion of oxygen layers", Department of Electrical Engineering and Computer Science, University of California, Berkeley, 2012, pp. 1-4.
(Continued)

*Primary Examiner* — Alexander G Ghyka
(74) *Attorney, Agent, or Firm* — ALLEN, DYER, DOPPELT, + GILCHRIST, P.A.

(57) ABSTRACT

A method for making a semiconductor device may include forming a first single crystal silicon layer having a first percentage of silicon 28, and forming a superlattice above the first single crystal silicon layer. The superlattice may include a plurality of stacked groups of layers, with each group of layers comprising a plurality of stacked base silicon monolayers defining a base silicon portion, and at least one non-semiconductor monolayer constrained within a crystal lattice of adjacent base silicon portions. The method may further include forming a second single crystal silicon layer above the superlattice having a second percentage of silicon 28 higher than the first percentage of silicon 28.

27 Claims, 11 Drawing Sheets

(56) References Cited

U.S. PATENT DOCUMENTS

| | | | |
|---|---|---|---|
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |
| 6,376,337 B1 | 4/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,886,668 B2 | 2/2018 | Dzurak et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 10,636,879 B2 | 4/2020 | Rao |
| 10,727,049 B2 | 7/2020 | Weeks et al. |
| 10,741,436 B2 | 8/2020 | Stephenson et al. |
| 10,763,370 B2 | 9/2020 | Stephenson |
| 10,777,451 B2 | 9/2020 | Stephenson et al. |
| 10,811,498 B2 | 10/2020 | Weeks et al. |
| 10,818,755 B2 | 10/2020 | Takeuchi et al. |
| 10,825,901 B1 | 11/2020 | Burton et al. |
| 10,825,902 B1 | 11/2020 | Burton et al. |
| 10,840,335 B2 | 11/2020 | Takeuchi et al. |
| 10,840,336 B2 | 11/2020 | Connelly et al. |
| 10,840,337 B2 | 11/2020 | Takeuchi et al. |
| 10,840,388 B1 | 11/2020 | Burton et al. |
| 10,847,618 B2 | 11/2020 | Takeuchi et al. |
| 10,854,717 B2 | 12/2020 | Takeuchi et al. |
| 10,868,120 B1 | 12/2020 | Burton et al. |
| 2003/0034529 A1 | 2/2003 | Fitzgerald et al. |
| 2003/0057416 A1 | 3/2003 | Currie et al. |
| 2004/0169225 A1 | 9/2004 | Burden |
| 2005/0282330 A1 | 12/2005 | Mears et al. |
| 2006/0220118 A1 | 10/2006 | Stephenson et al. |
| 2006/0267130 A1 | 11/2006 | Rao |
| 2007/0012910 A1 | 1/2007 | Mears et al. |
| 2007/0020833 A1 | 1/2007 | Mears et al. |
| 2007/0267572 A1 | 11/2007 | Toh et al. |
| 2008/0012004 A1 | 1/2008 | Huang et al. |
| 2008/0258134 A1 | 10/2008 | Mears et al. |
| 2011/0215299 A1 | 9/2011 | Rao |
| 2015/0357414 A1 | 12/2015 | Mears |
| 2016/0149023 A1 | 5/2016 | Mears et al. |
| 2016/0358773 A1 | 12/2016 | Mears et al. |
| 2017/0179316 A1 | 6/2017 | Balakrishnan et al. |
| 2018/0122925 A1 | 5/2018 | Balakrishnan et al. |
| 2019/0043968 A1 | 2/2019 | Lamport et al. |
| 2019/0058059 A1 | 2/2019 | Stephenson et al. |
| 2019/0189652 A1 | 6/2019 | Chen et al. |
| 2019/0279897 A1 | 9/2019 | Stephenson et al. |
| 2019/0317277 A1 | 10/2019 | Stephenson |
| 2019/0319135 A1 | 10/2019 | Stephenson |
| 2019/0319167 A1 | 10/2019 | Stephenson |
| 2020/0135489 A1 | 4/2020 | Weeks et al. |
| 2020/0343367 A1 | 10/2020 | Takeuchi et al. |
| 2020/0343380 A1 | 10/2020 | Takeuchi et al. |
| 2022/0352322 A1* | 11/2022 | Hytha ............... H01L 29/1079 |

FOREIGN PATENT DOCUMENTS

| | | |
|---|---|---|
| JP | 2000260974 | 9/2000 |
| WO | 2015077580 | 5/2015 |

OTHER PUBLICATIONS

U.S. Appl. No. 16/513,825, filed 17/17, 2019; Burton et al.
U.S. Appl. No. 16/513,832, filed 17/17, 2019 Burton et al.
U.S. Appl. No. 16/513,875, filed 17/17, 2019 Burton et al.
U.S. Appl. No. 16/513,906, filed 17/17, 2019 Burton et al.

(56) References Cited

OTHER PUBLICATIONS

U.S. Appl. No. 16/801,287, filed Feb. 26, 2020 Weeks et al.
U.S. Appl. No. 16/801,305, filed Feb. 26, 2020 Weeks et al.
U.S. Appl. No. 16/810,957, filed Mar. 6, 2020 Cody et al.
U.S. Appl. No. 16/898,564, filed Jun. 11, 2020 Takeuchi et al.
U.S. Appl. No. 16/898,589, filed Jun. 11, 2020 Takeuchi et al.
U.S. Appl. No. 16/913,487, filed Jun. 26, 2020 Burton et al.
U.S. Appl. No. 16/913,546, filed Jun. 26, 2020 Burton et al.
U.S. Appl. No. 17/020,353, filed Sep. 14, 2020; Weeks et al.
U.S. Appl. No. 17/101,399, filed Nov. 23, 2020 Stephenson et al.
U.S. Appl. No. 17/236,329, filed Apr. 21, 2021 Hytha et al.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu "Phenomena in silicon nanostructure device" published online Sep. 6, 2000 by Applied Physics and Materials Science & Processing, pp. 391-402.
R. Tsu "Si Based Green ELD: Si-Oxygen Superlattice" wysiwyg://I/http://www3.interscience.wiley.com/cgi-bin/abstract/72512946/ start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Connelly et al. "Suppressing Oxidation-Enhanced Diffusion of Boron via Buried Epitaxial Oxygen-Inserted Layers in Silicon" 2018 IEEE 2nd Electron Devices Technology and Manufacturing Conference (EDTM), Kobe, 2018, pp. 163-165. Abstract Only.
Mazzocchi et al. "99.992% 28Si CVD-grown epilayer on 300 mm substrates for large scale integration of silicon spin qubits" Journal of Crystal Growth, vol. 509, 2019, pp. 7.
Kizilyali et al. "Power Transistors Fabricated using Isotopically Purified Silicon" IEEE Electron Device Letters, vol. 26, No. 6, pp. 404-406, (Jun. 2005). Abstract Only.
S.J. Burden "High Thermal Conductivity Silicon" Semiconductor Fabtech Magazine, Thirteenth Edition, (2002); pp. 297-302.
Cahill et al. "Thermal conductivity of isotopically pure and Ge-doped Si epitaxial layers from 300 to 550 K" Physical Review B, 70, 235322 (2004); pp. 3.
Capinski et al. "Thermal Conductivity of Isotopically Enriched Silicon" Applied Physics Letters, vol. 71, No. 15, (1997) Abstract Only.
Ruf et al. "Thermal Conductivity of Isotopically Enriched Silicon" Solid State Communications, vol. 115, No. 5, Jun. 19, 2000; Abstract Only.
Kamarov et al. "Transient Thermo-Reflectance Measurements of the Thermal Conductivity and Interface Resistance of Metallized Natural and Isotopically Pure Silicon" Microelectronic Journal, vol. 34, No. 12; Dec. 2003; Abstract Only.
Ruf et al. Erratum to "Thermal conductivity of isotopically enriched silicon" Solid State Communications, vol. 127, p. 257, (2003); No Abstract Available.
Leon et al. "Coherent spin control of s-, p-, d- and f-electrons in a silicon quantum dot" Nature Communications (2020) 11:797 www.nature.com/naturecommunications: pp. 6.
Veldhorst et al. "Silicon CMOS architecture for a spin-based quantum computer" Nature Communications; 8:0766: www.nature.com/naturecommunications; pp. 8.
Maurand et al. "A CMOS silicon spin qubit" Nature Communications May 2016 https://www.researchgate.net/publication/303488864; pp. 12.
Ladd et al. "Silicon Qubits" https://doi.org/10.1016/B978-0-12-803581-8.09736-8; Feb. 28, 2018; Abstract Only.
Sandia National Laboratories "Silicon-Based Quantum Information Sciences Grand Challenge" https://www.osti.gov/biblio/1706399-silicon-based-quantum-information-sciences-grand-challenge: Aug. 1, 2008; pp. 2.
Jan Ove Odden "Monoisotopic Silicon-28 (28Si)" isosilicon.com/wp-content/uploads/2016/01/JO-Odden-Si-28.pdf 2006; pp. 10.
Karaiskaj et al. "Photoluminescence of Isotopically Purified Silicon: How Sharp are Bound Exciton Transitions?" Physical Review Letters; vol. 86; No. 26; Jun. 25, 2001; pp. 4.
Tang et al. "Targeted enrichment of 28Si thin films for quantum computing" J. Phys. Commun. 4 (2020) 035006: https://doi.org/10.1088/2399-6528/ab7b33: pp. 7.
Odden et al. "Separation of Isotopes" Isosilicon http://isosilicon.com/en/our-technology/ 2006; pp. 18.
Andrew Dzurak "Silicon-based Quantum Computing: The path from laboratory to industrial manufacture" Letil innovation Days, Grenoble, France, Jul. 4, 2018; pp. 44.
Erikson et al. "New separation methods for production of light stable isotopes for use in nuclear technology" 3rd INCC, Sicily—Italy; Sep. 18-23, 2011; pp. 24.
Wolfowicz et al. "Decoherence mechanisms of 209Bi donor electron spins in isotopically pure 28Si" Physical review. B, Condensed matter; Jul. 2012; pp. 5.
Anonymous "Silicon-28 Next Generation Material for Semiconductors" http://isosilicon.com/wp-content/uploads/2016/01/Isosilicon2016-2007-rev-2016-acknowl.pdf retreived from internet Jun. 11, 2021; pp. 14.
Zhao et al. "Single-spin qubits in isotopically enriched silicon at low magnetic field" Nature Communications: vol. 10, Article No. 5500 (2019); pp. 10.
Divincenzo et al. "Quantum Information is Physical" Superlattices and Microstructures 23, 419 (1998); http://isosilicon.com/wp-content/uploads/2016/01/Isosilicon2016-2007-rev-2016-acknowl.pdf: pp. 11.

* cited by examiner

METHOD FOR MAKING SEMICONDUCTOR DEVICE INCLUDING A SUPERLATTICE AND ENRICHED SILICON 28 EPITAXIAL LAYER

TECHNICAL FIELD

The present disclosure generally relates to semiconductor devices and, more particularly, to semiconductor devices with enhanced semiconductor materials and associated methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include forming a first single crystal silicon layer having a first percentage of silicon 28, and forming a superlattice above the first single crystal silicon layer. The superlattice may include a plurality of stacked groups of layers, with each group of layers comprising a plurality of stacked base silicon monolayers defining a base silicon portion, and at least one non-semiconductor monolayer constrained within a crystal lattice of adjacent base silicon portions. The method may further include forming a second single crystal silicon layer above the superlattice having a second percentage of silicon 28 higher than the first percentage of silicon 28.

By way of example, the first percentage of silicon 28 may be less than 93 percent, and the second percentage of silicon 28 may greater than 95 percent, and more particularly greater than 99 percent. In an example implementation, a third single crystal semiconductor layer may be formed between the first single crystal semiconductor layer and the superlattice and having a third percentage of silicon 28 higher than the first percentage of silicon 28. In still another example embodiment, a third single crystal semiconductor layer may be formed between the superlattice and the second single crystal semiconductor layer.

In one example implementation, the superlattice layer may comprise a first superlattice layer above the first single crystal semiconductor layer, and the method may further include forming a third single crystal semiconductor layer above the first superlattice, and forming a second superlattice above the third single crystal semiconductor layer and below the second single crystal semiconductor layer. In accordance with another example, the superlattice layer may be on the first single crystal silicon layer, and the second single crystal silicon layer may be on the superlattice layer.

The first single crystal silicon layer may have a first thickness and the second single crystal silicon layer may have a second thickness less than the first thickness, for example. In an example embodiment, the method may also include forming at least one circuit device associated with the second single crystal silicon layer. By way of example, the at least one circuit device may comprise a plurality of quantum bit devices. In accordance with another example, forming the at least one circuit device may include forming spaced apart source and drain regions in the second single crystal silicon layer defining a channel therebetween, and forming a gate comprising a gate dielectric layer overlying the channel and a gate electrode overlying the gate dielectric layer. By way of example, the at least one non-semiconductor monolayer may comprise oxygen.

DETAILED DESCRIPTION

Figure 1:
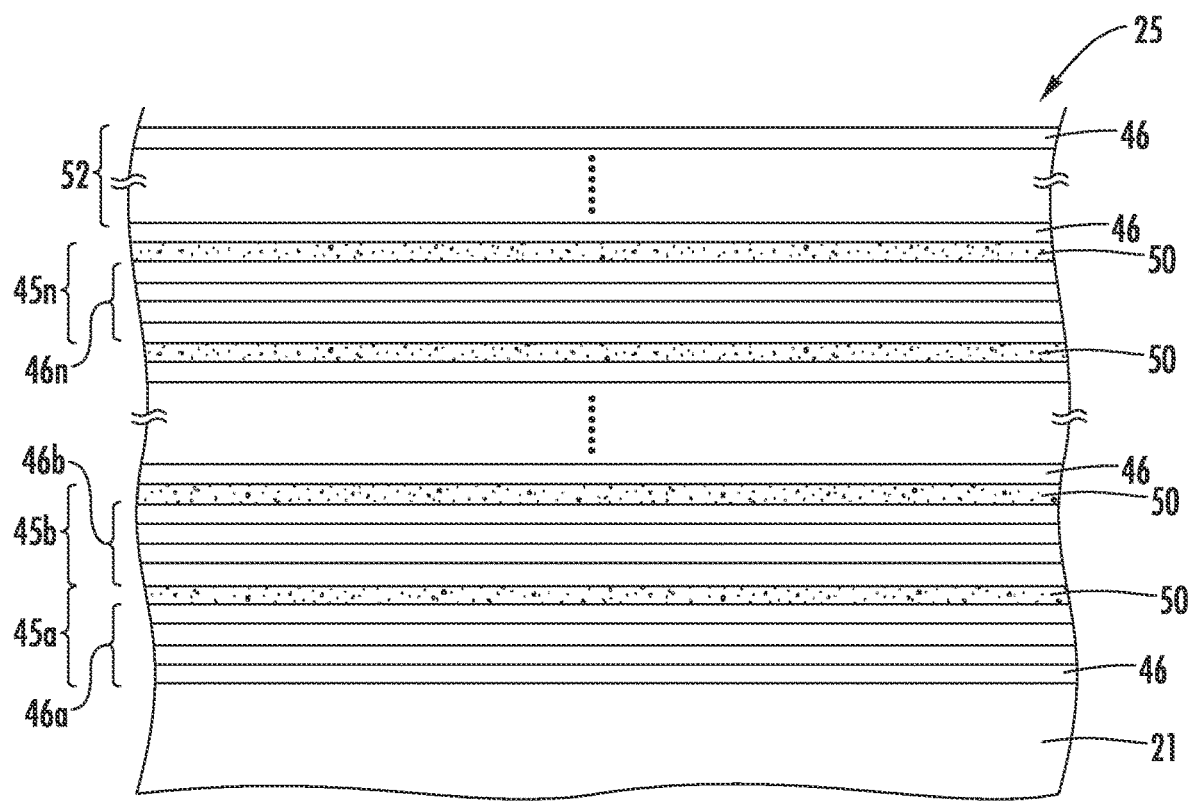
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to the formation of semiconductor devices utilizing an enhanced semiconductor superlattice. The enhanced semiconductor superlattice is also referred to as an "MST" layer/film or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k, n))_i (\nabla_k E(k, n))_j \frac{\partial f(E(k, n), E_F, T)}{\partial E} d^3k}{\sum_{E>E_F} \int_{B.Z.} f(E(k, n), E_F, T) d^3k}$$

for electrons and:

$$M_{h,ij}^{-1}(E_F, T) = \frac{-\sum_{E<E_F} \int_{B.Z.} (\nabla_k E(k, n))_i (\nabla_k E(k, n))_j \frac{\partial f(E(k, n), E_F, T)}{\partial E} d^3k}{\sum_{E<E_F} \int_{B.Z.} (1 - f(E(k, n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
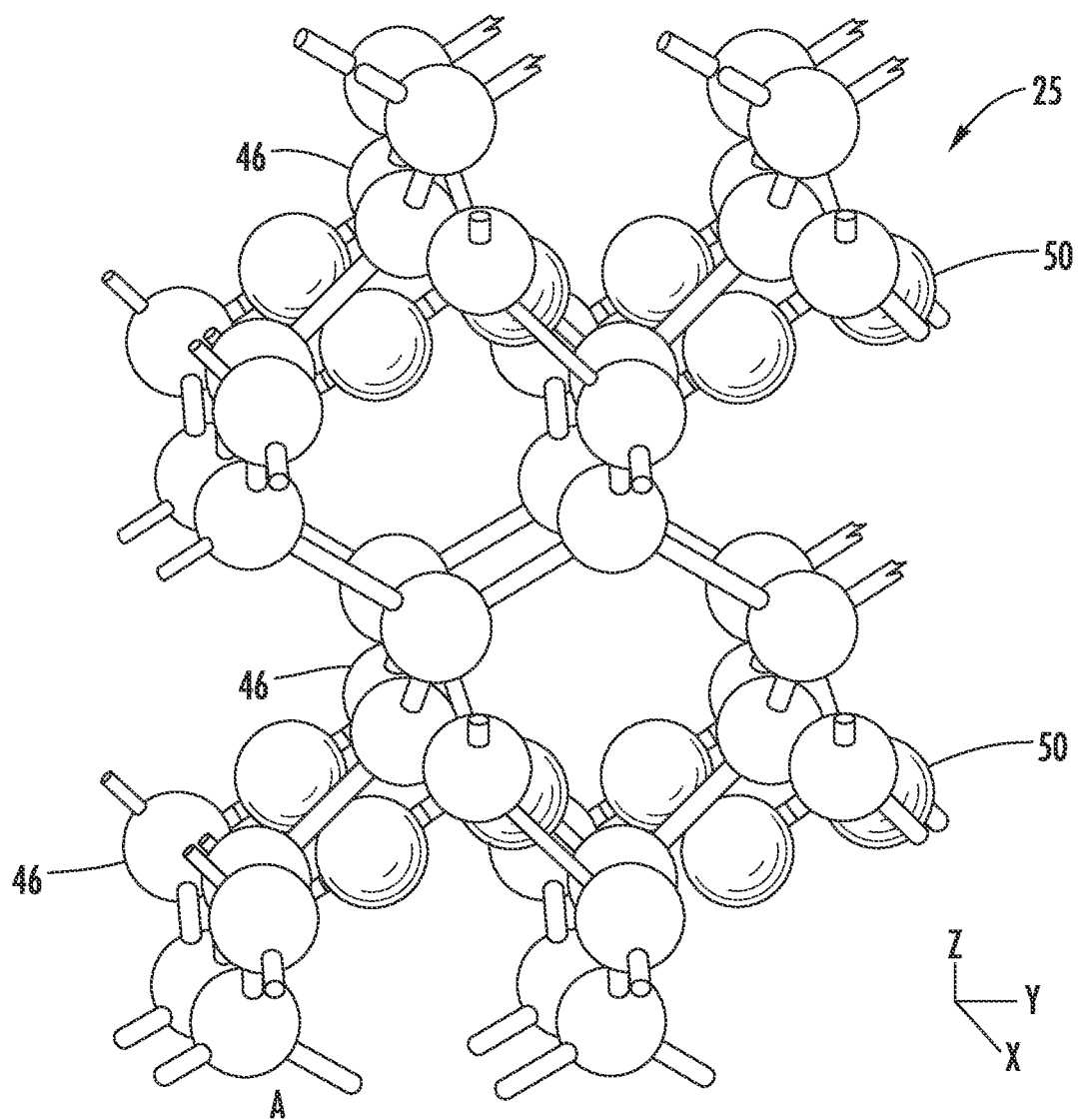
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
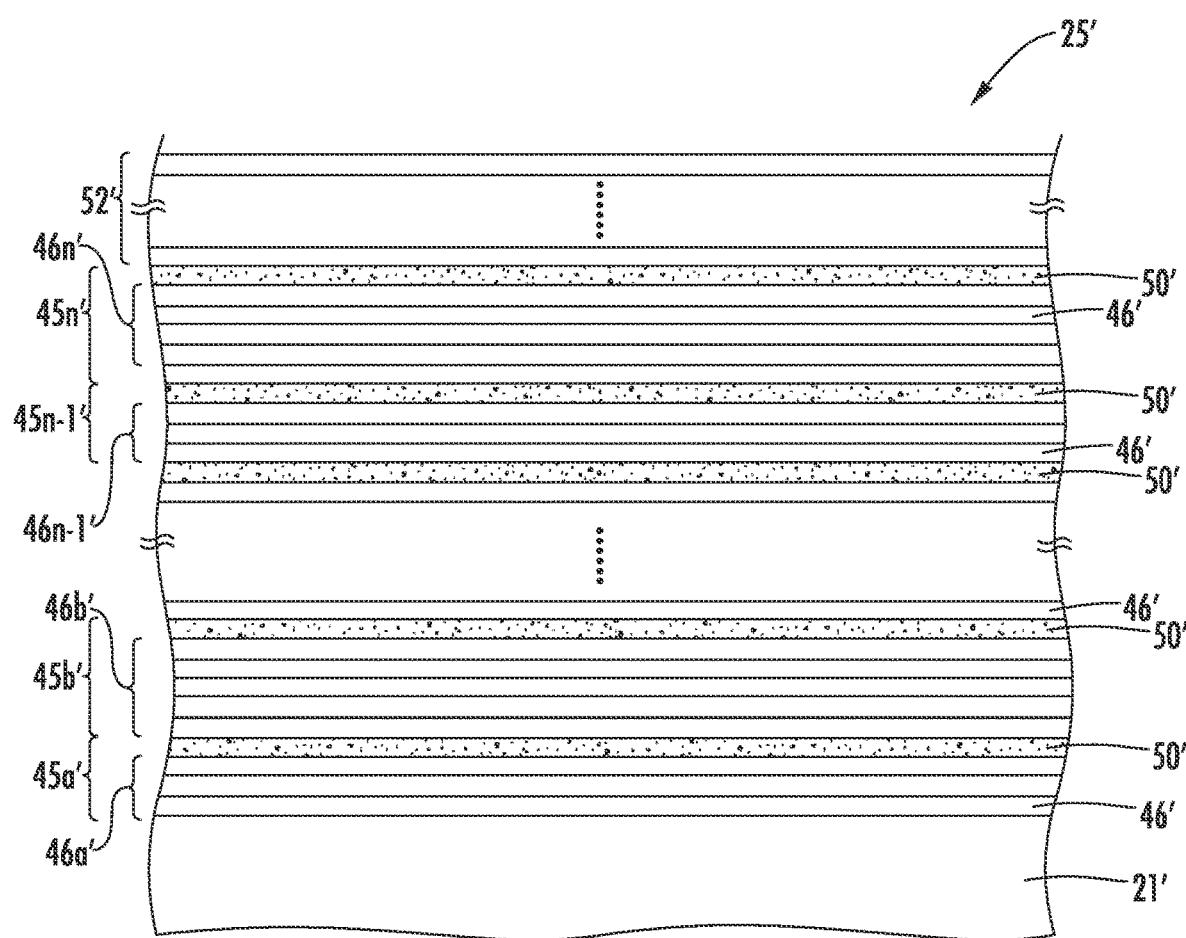
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
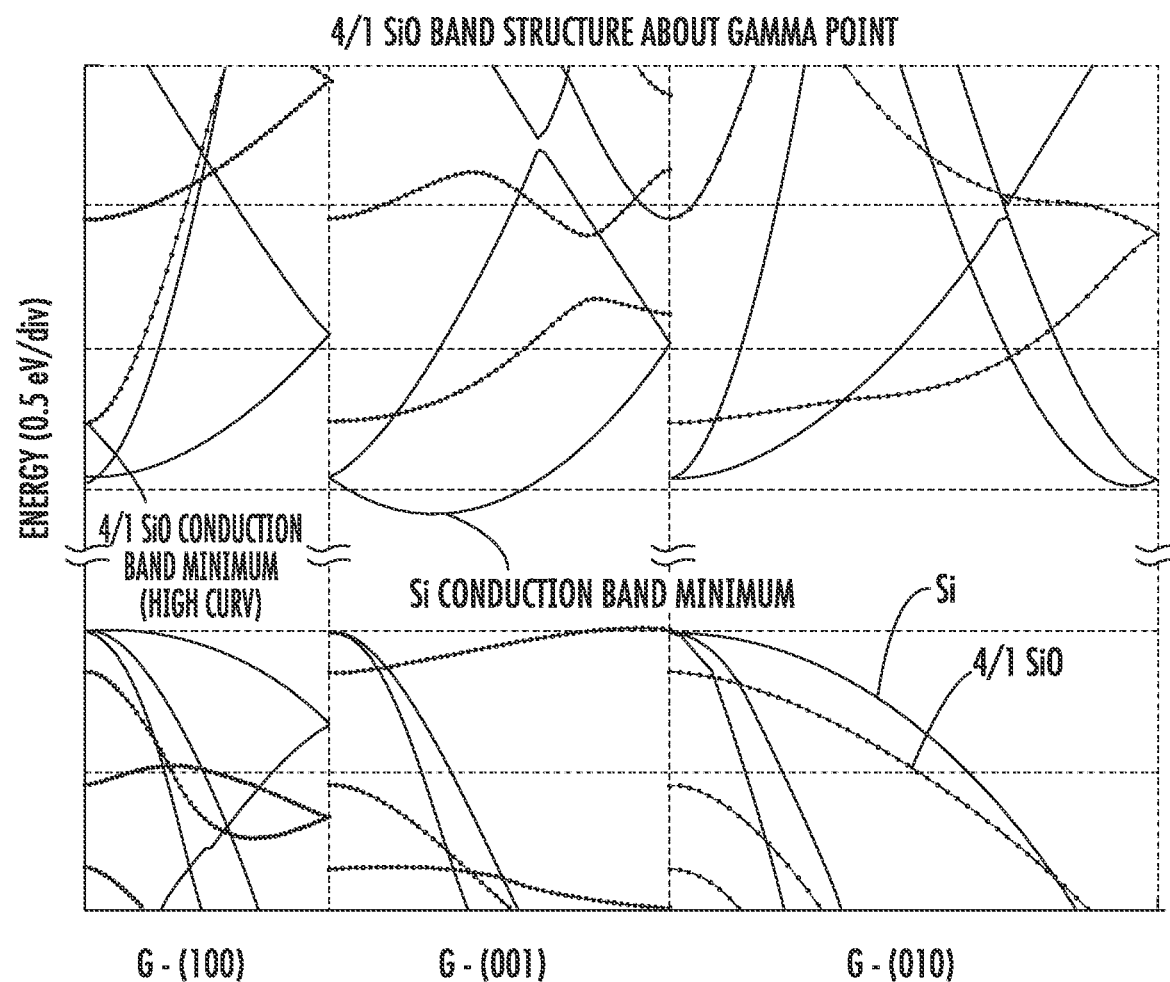
FIG. 4A is a graph of the calculated band structure from the gamma point (G) for both bulk silicon as in the prior art, and for the 4/1 Si/O superlattice as shown in FIGS. 1-2.
Figure 4B:
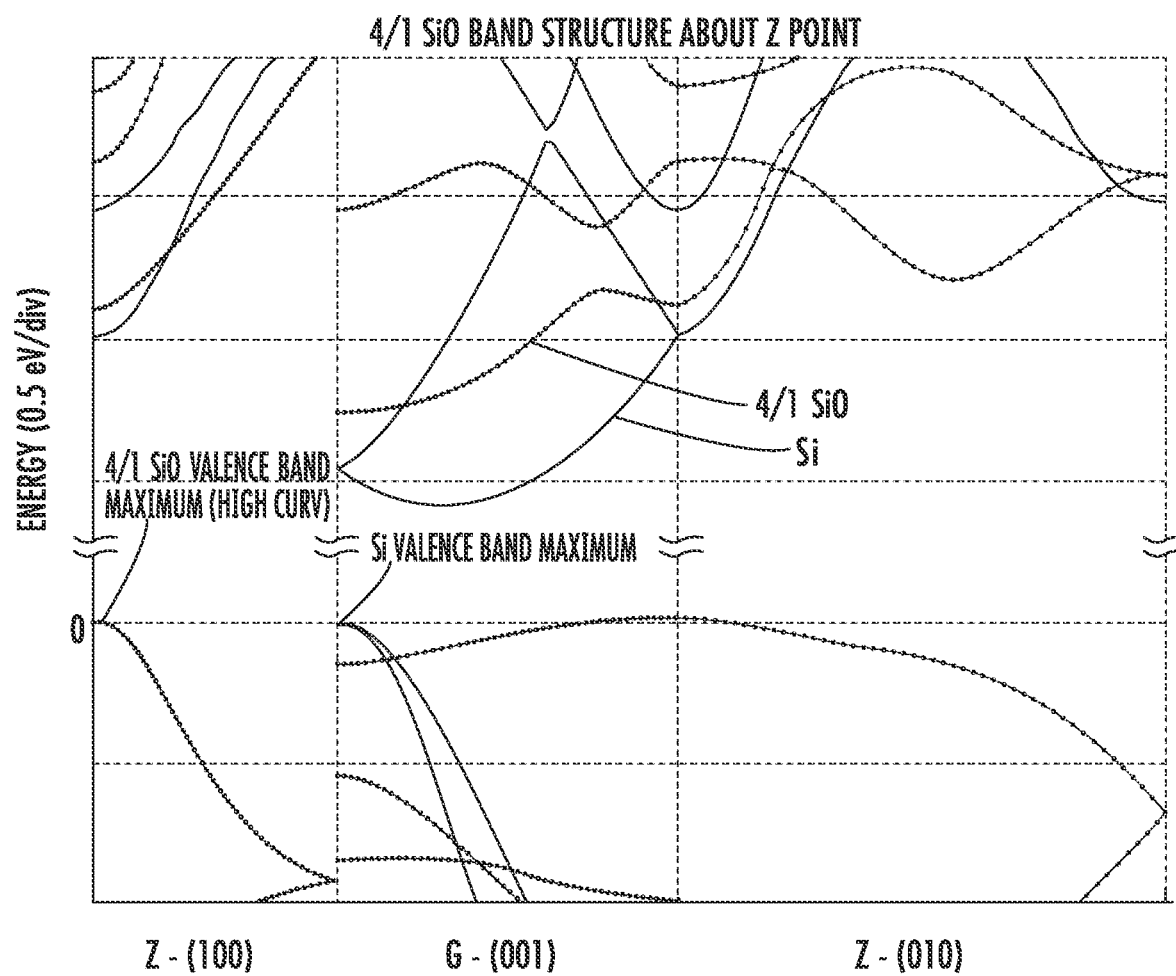
FIG. 4B is a graph of the calculated band structure from the Z point for both bulk silicon as in the prior art, and for the 4/1 Si/O superlattice as shown in FIGS. 1-2.
Figure 4C:
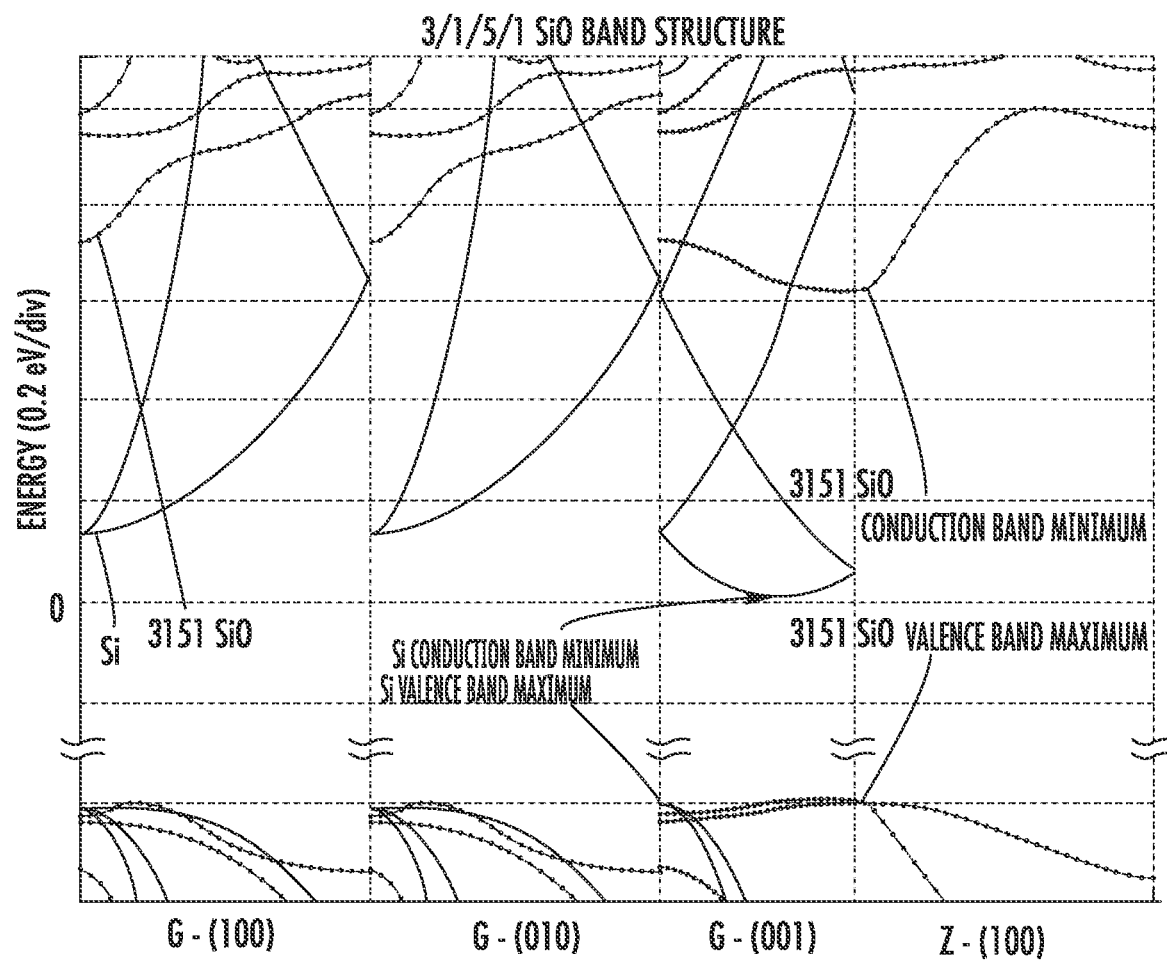
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
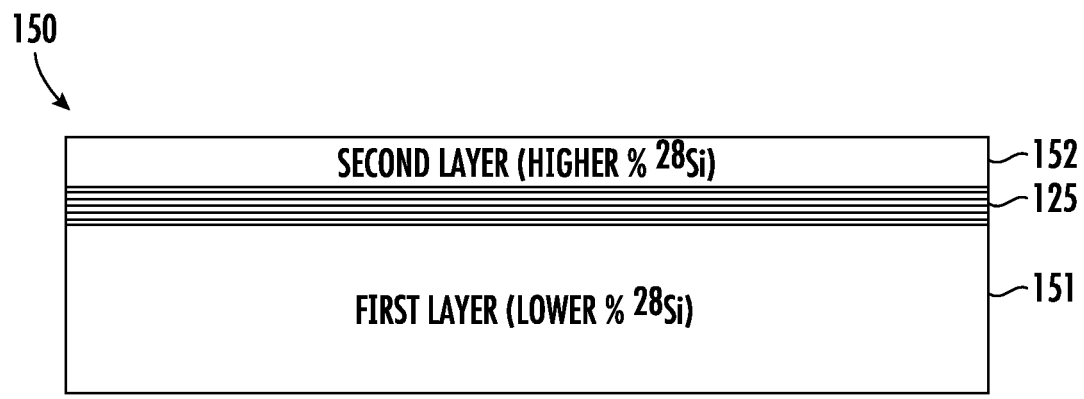
FIG. 5 is a schematic block diagram of a semiconductor device including an enriched $^{28}$Si epitaxial layer formed on a superlattice in accordance with an example embodiment.
Figure 11:
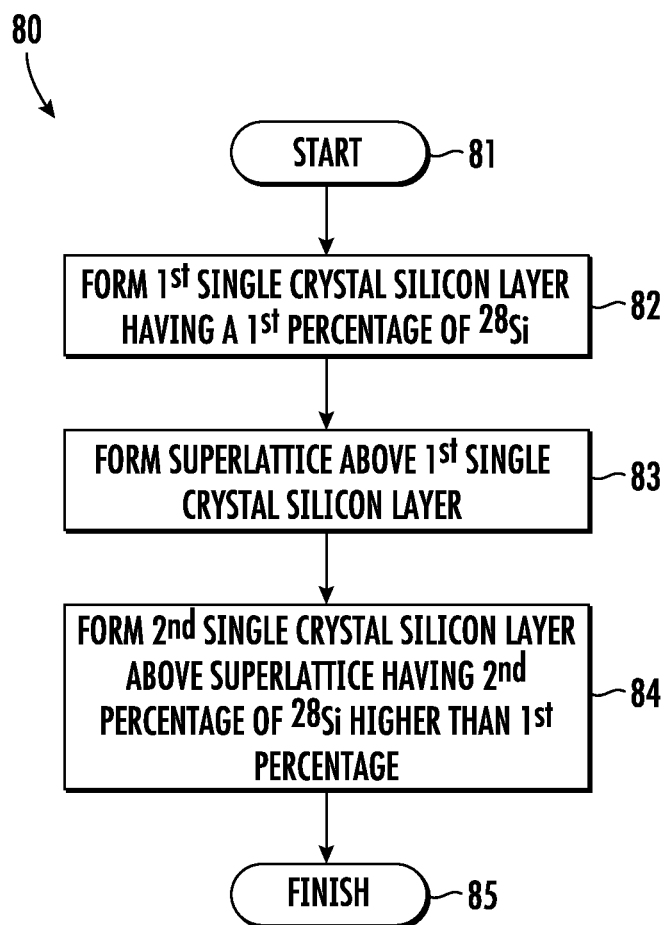
FIG. 11 is a flow diagram illustrating method aspects associated with the fabrication of the semiconductor devices of FIGS. 5-10.

An example approach for fabricating a semiconductor device 150 using the above-described superlattice structures to provide an enriched $^{28}$Si active device layer is first described with reference to FIG. 5 and the flow diagram 80 of FIG. 11. By way of background, silicon has multiple natural stable isotopes. The most abundant natural stable isotopes are $^{28}$Si (92.23%), $^{20}$Si (4.67%), and $^{30}$Si (3.10%). There are several advantages to $^{28}$Si substrates. For example, they have higher thermo-conductivity (better heat dissipation), and a higher decoherence time which is useful for qubit applications.

On the other hand, there is a substantial cost related to the purification of $^{28}$Si, and thus production of $^{28}$Si in large quantities (e.g., as a substrate) can be cost prohibitive. As a result, some attempts have been made to form $^{28}$Si layers on top of a natural silicon substrate (i.e., having 92.23% or less $^{28}$Si). However, due to silicon interdiffusion, a relatively thick $^{28}$Si epitaxial layer still needs to be grown on the substrate. In still another approach, to prevent silicon intermixing, designs utilizing a silicon-on-insulator (SOI) approach have also been proposed. While this allows for a relatively thin $^{28}$Si layer, the SOI technology used for this implementation is costly as well.

Figure 8:
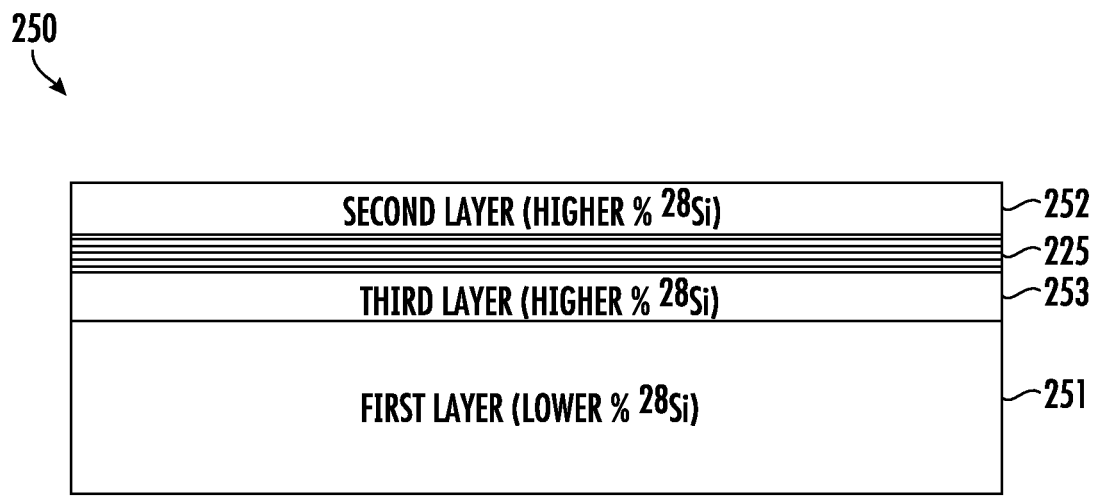
FIG. 8 is a schematic block diagram of an alternative embodiment of the semiconductor device of FIG. 5.

In the illustrated example, beginning at Block 81, a first single crystal silicon layer 151 (e.g., a substrate) is provided having a first percentage of $^{28}$Si, at Block 82. Furthermore, a superlattice 125 is grown on the first single crystal layer 151 (Block 83), such as the Si/O superlattice structures described further above. Additionally, a second single crystal silicon layer 152 (e.g., an active device layer) is epitaxially grown on the superlattice 125, at Block 84. More particularly, the second percentage of $^{28}$Si is higher than the first percentage of $^{28}$Si, defining an isotropically enriched, high concentration $^{28}$Si layer. The method of FIG. 8 illustratively concludes at Block 85.

The first silicon layer 151 has a first thickness, and the second silicon layer 152 has a second thickness less than the first thickness. In other words, the first silicon layer 151 may serve as the substrate for the semiconductor device 150, while the second silicon layer 152 may serve as an epitaxial active layer in which additional circuitry may be formed to take advantage of the enhanced $^{28}$Si properties, yet at relatively low fabrication costs. In the illustrated configuration, the superlattice 125 advantageously acts as a physical barrier to help prevent intermixing of the first layer 151 with $^{28}$Si<93% and the second layer 152 with $^{28}$Si>95%.

Figure 6:
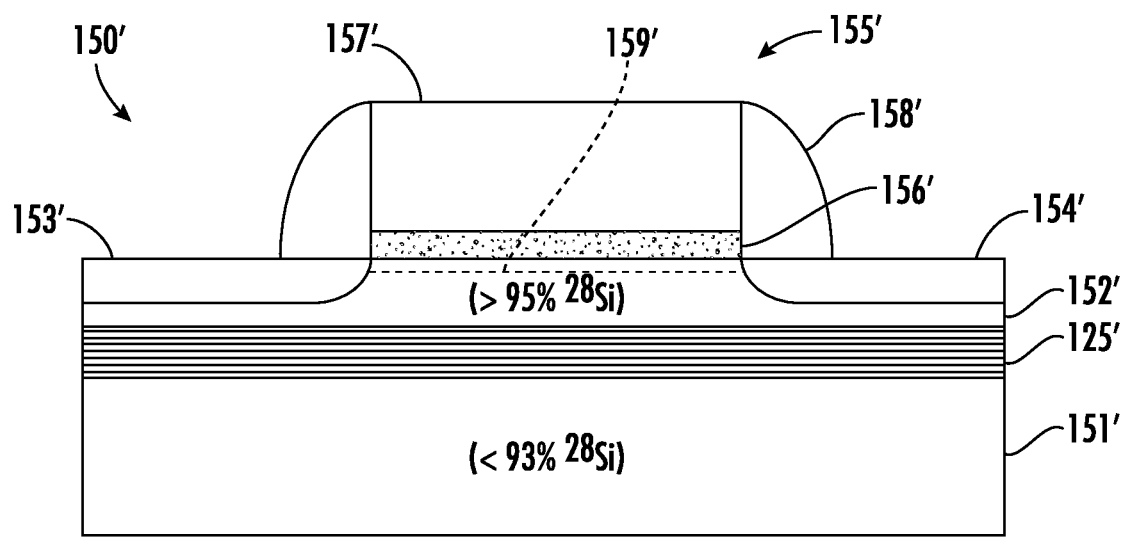
FIG. 6 is a schematic block diagram of a semiconductor device including a MOSFET formed on an enriched $^{28}$Si epitaxial layer in accordance with an example embodiment.

Referring additionally to FIG. 6, in accordance with one example implementation of a semiconductor device 150', the additional circuitry illustratively includes one or more MOSFET devices (e.g., CMOS) associated with the second silicon layer 152'. More particularly, the MOSFET illustratively includes spaced apart source and drain regions 153', 154' in the second single crystal silicon layer 152' defining a channel 159' therebetween, and a gate 155' including a gate dielectric layer 156' (e.g., SiO$_2$) overlying the channel and a gate electrode 157' overlying the gate dielectric layer. Sidewall spacers 158' are also formed adjacent the gate 155'. In this example, the first silicon layer 151' has less than 93% $^{28}$Si, while the second silicon layer 152' has at least 95% $^{28}$Si, although different percentages may be used in different embodiments.

Figure 7:
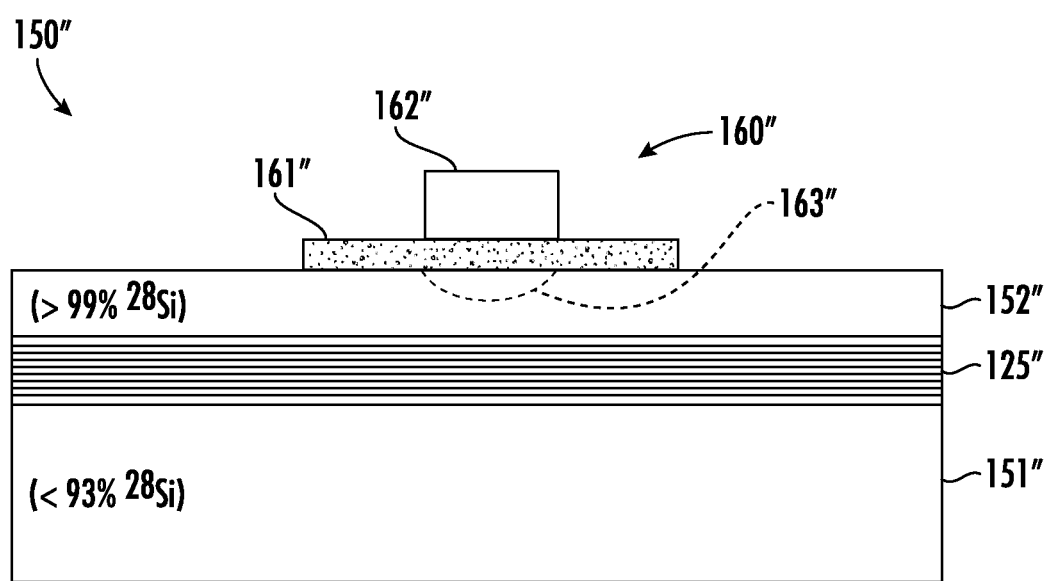
FIG. 7 is a schematic block diagram of a semiconductor device including a quantum bit (qubit) device formed on an enriched $^{28}$Si epitaxial layer in accordance with an example embodiment.

Turning to FIG. 7, in accordance with another example implementation a semiconductor device 150" illustratively includes one or more quantum bit (qubit) devices 160" associated with the second silicon layer 152". More particularly, the quantum bit device 160" illustratively includes an insulating layer 161" (e.g., SiO$_2$) on the second silicon layer 152", and a gate electrode 160" on the insulating layer defining a hole or electron isolation area 163" beneath the gate electrode in the second single crystal silicon layer. In this example, the first silicon layer 151" has less than 93% $^{28}$Si, while the second silicon layer 152" has at least 99% $^{28}$Si, although different percentages may be used in different embodiments. Further implementations details and examples of quantum devices which may be used are set forth in the following references, which are hereby incorporated herein in their entireties by reference: U.S. Pat. No. 9,886,668 to Dzurak et al; "Coherent spin control of s-, p-, d- and f-electrons in a silicon quantum dot" by Leon et al. (Nature Communications, (2020) 11:797); "Single-spin qubits in isotropically enriched silicon at low magnetic field" by Zhao et al. (Nature Communications, (2019) 10:5500); and "Silicon CMOS architecture for a spin-based quantum computer" by Veldhorst et al. (Nature Communications, (2017) 8:1766).

Turning now to FIG. 8, another example embodiment of a semiconductor device 250 illustratively includes a first single crystal silicon layer 251 (e.g., a substrate) having a first percentage of $^{28}$Si, a superlattice 225, and a second single crystal silicon layer 252 (e.g., an active device layer) similar to those discussed above with respect to FIG. 5. However, in the present example a third single crystal semiconductor layer 253 is epitaxially grown on the first layer 253, and the superlattice 225 is formed on the third single crystal semiconductor layer. More particularly, the third single crystal semiconductor layer 253 has a third percentage of $^{28}$Si which is also higher than the first percentage of $^{28}$Si, defining an isotropically enriched, high concentration $^{28}$Si layer. For example, the third single crystal semiconductor layer 253 may be used as a seed layer to start the transition from the lower (first) percentage of $^{28}$Si to the higher (second) percentage $^{28}$Si before depositing the superlattice layer 225. In an example embodiment, the concentration of $^{28}$Si may be graded or increase from the bottom of the layer to the top, or the concentration of $^{28}$Si may be relatively consistent across the third layer in some embodiments.

The silicon monolayers 46 of the superlattice 225 may also be formed with enriched $^{28}$Si. In this regard, it should be noted that in some embodiments, the third layer 253 may be absent, but the transition to the enriched $^{28}$Si may take place in the silicon monolayers 46 of the superlattice 225. That is, some or all of the monolayers 46 of the superlattice 225 may be formed with enriched $^{28}$Si, with or without the third layer 225.

Figure 9:
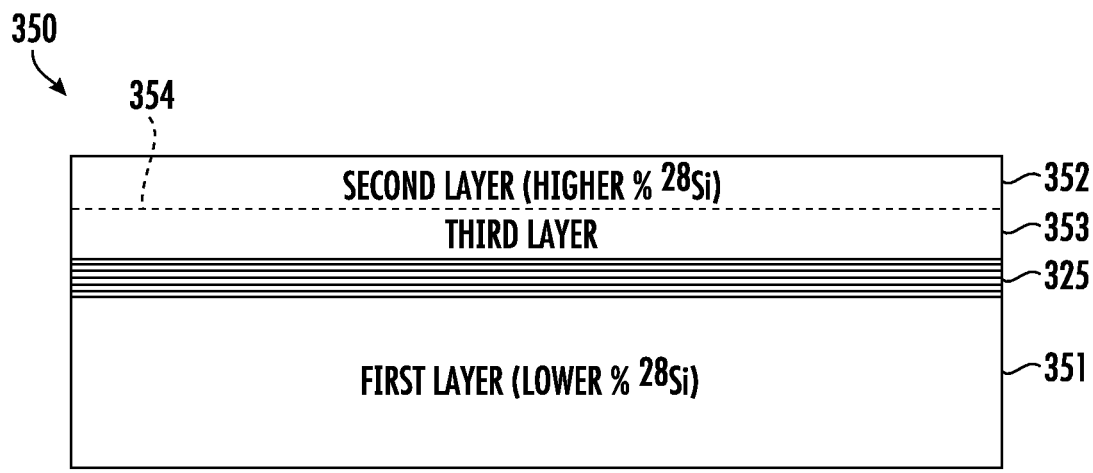
FIG. 9 is a schematic block diagram of another alternative embodiment of the semiconductor device of FIG. 5.

Turning now to FIG. 9, in another example embodiment a semiconductor device 350 illustratively includes a first single crystal silicon layer 351 (e.g., a substrate) having a first percentage of $^{28}$Si, a superlattice 325, and a second single crystal silicon layer 352 (e.g., an active device layer) similar to those discussed above with respect to FIG. 5. However, in the present example a third single crystal semiconductor layer 353 is epitaxially grown on the superlattice 325, and is accordingly between the superlattice and the second single crystal semiconductor layer 352.

In this configuration, rather than providing a physical barrier to intermixing of silicon from the first and second layers 351, 352 as with the device 250, here the interstitial trapping properties of the superlattice 325 help prevent intermixing by eliminating silicon interstitials from the system. Interstitials contribute to silicon self-diffusion, which leads to in silicon intermixing. To target this, the depth of the superlattice 325 may be set by the thickness of the third layer 353 to the desired distance under the transition region or interface 354. Further details regarding use of superlattices to help reduce silicon interstitials are provided in U.S. Pat. No. 10,580,866 to Takeuchi et al. and U.S. Pat. No. 9,941,359 to Mears et al., which are both hereby incorporated herein in their entireties by reference. The third layer 353 may have the same or similar $^{28}$Si concentration to that of the first layer 351, for example, making the superlattice 325 a "buried" layer with respect to the transition region 354. However, in some embodiments the third layer 353 may also have an enhanced $^{28}$Si concentration as discussed above with reference to FIG. 8.

Figure 10:
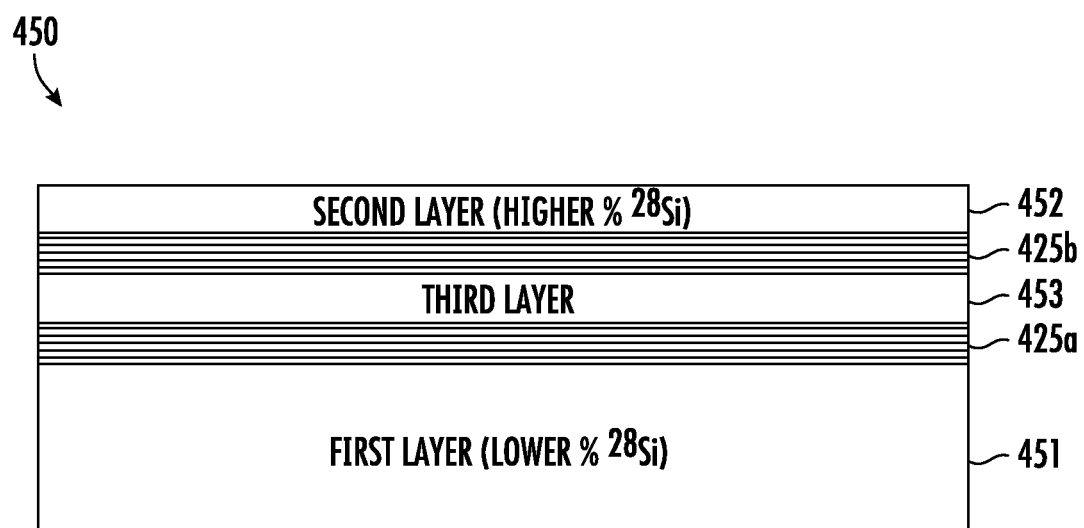
FIG. 10 is a schematic block diagram of an still another alternative embodiment of the semiconductor device of FIG. 5.

Referring additionally to FIG. 10, an example semiconductor device 450 in which multiple superlattices 425a, 425b are utilized for both interstitial trapping and as a physical barrier is now described. More particularly, the semiconductor device 450 illustratively includes a first single crystal silicon layer 451 (e.g., a substrate) having a first percentage of $^{28}$Si, a first superlattice 425a on the first single crystal silicon layer, a third silicon layer 453 on the first superlattice, the second superlattice 425b on the third silicon layer, and a second single crystal silicon layer 452 (e.g., an active device layer). The first, second, and third layers 451-453 may be similar to layers 351-353 discussed above with respect to FIG. 9. Accordingly, this configuration advantageously provides a combination of interstitial trapping and a physical barrier to help prevent the intermixing of silicon atoms between the first and second layers 451, 452.

The foregoing embodiments provide a relatively low cost approach for growing purified $^{28}$Si layers on a silicon substrate using the above-described superlattice structures. In addition to the above-noted advantages of $^{28}$Si, the above-described configurations provide additional advantages as a result of the incorporated superlattice(s). More particularly, in addition to the relatively low cost fabrication as a result of the superlattice(s), the superlattice(s) advantageously help prevent silicon intermixing, allowing for a relatively thin $^{28}$Si epitaxial (active) layer. Additionally, as noted above, the superlattice(s) can help reduce silicon interstitials from the $^{28}$Si epitaxial layer, as discussed further in the aforementioned '866 and '359 patents. This helps to even further decrease interdiffusion. Additionally, elimination of interstitial point defects increases the effective silicon purity, allowing for even higher quantum decoherence times for quantum device applications.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
    forming a first single crystal silicon layer having a first percentage of silicon 28;
    forming a superlattice above the first single crystal silicon layer, the superlattice comprising a plurality of stacked groups of layers, each group of layers comprising a plurality of stacked base silicon monolayers defining a base silicon portion, and at least one non-semiconductor monolayer constrained within a crystal lattice of adjacent base silicon portions; and
    forming a second single crystal silicon layer above the superlattice having a second percentage of silicon 28 higher than the first percentage of silicon 28.

2. The method of claim 1 wherein the first percentage of silicon 28 is less than 93 percent.

3. The method of claim 1 wherein the second percentage of silicon 28 is greater than 95 percent.

4. The method of claim 1 wherein the second percentage of silicon 28 is greater than 99 percent.

5. The method of claim 1 further comprising forming a third single crystal silicon layer between the first single crystal silicon layer and the superlattice and having a third percentage of silicon 28 higher than the first percentage of silicon 28.

6. The method of claim 1 further comprising forming a third single crystal silicon layer between the superlattice and the second single crystal silicon layer.

7. The method of claim 1 wherein the superlattice comprises a first superlattice above the first single crystal silicon layer; and further comprising:
    forming a third single crystal silicon layer above the first superlattice; and
    forming a second superlattice above the third single crystal silicon layer and below the second single crystal silicon layer.

8. The method of claim 1 wherein the superlattice is on the first single crystal silicon layer, and the second single crystal silicon layer is on the superlattice.

9. The method of claim 1 wherein the first single crystal silicon layer has a first thickness and the second single crystal silicon layer has a second thickness less than the first thickness.

10. The method of claim 1 further comprising forming at least one circuit device associated with the second single crystal silicon layer.

11. The method of claim 10 wherein the at least one circuit device comprises a plurality of quantum bit devices.

12. The method of claim 10 wherein forming the at least one circuit device comprises:
    forming spaced apart source and drain regions in the second single crystal silicon layer defining a channel therebetween; and
    forming a gate comprising a gate dielectric layer overlying the channel and a gate electrode overlying the gate dielectric layer.

13. The method of claim 1 wherein the at least one non-semiconductor monolayer comprises oxygen.

14. A method for making a semiconductor device comprising:
    forming a first single crystal silicon layer having a first percentage of silicon 28 less than 93 percent;
    forming a superlattice above the first single crystal silicon layer, the superlattice comprising a plurality of stacked groups of layers, each group of layers comprising a plurality of stacked base silicon monolayers defining a base silicon portion, and at least one oxygen monolayer constrained within a crystal lattice of adjacent base silicon portions; and
    forming a second single crystal silicon layer above the superlattice having a second percentage of silicon 28 higher than 95 percent.

15. The method of claim 14 wherein the second percentage of silicon 28 is greater than 99 percent.

16. The method of claim 14 further comprising forming a third single crystal silicon layer between the first single crystal silicon layer and the superlattice and having a third percentage of silicon 28 higher than the first percentage of silicon 28.

17. The method of claim 14 further comprising forming a third single crystal silicon layer between the superlattice and the second single crystal silicon layer.

18. The method of claim 14 wherein the superlattice comprises a first superlattice above the first single crystal silicon layer; and further comprising:
    forming a third single crystal silicon layer above the first superlattice; and
    forming a second superlattice above the third single crystal semiconductor layer and below the second single crystal silicon layer.

19. The method of claim 14 wherein the superlattice is on the first single crystal silicon layer, and the second single crystal silicon layer is on the superlattice.

20. A method for making a semiconductor device comprising:
    forming a first single crystal silicon layer having a first percentage of silicon 28;

forming a superlattice above the first single crystal silicon layer, the superlattice comprising a plurality of stacked groups of layers, each group of layers comprising a plurality of stacked base silicon monolayers defining a base silicon portion, and at least one oxygen monolayer constrained within a crystal lattice of adjacent base silicon portions;

forming a second single crystal silicon layer above the superlattice having a second percentage of silicon 28 higher than the first percentage of silicon 28; and forming at least one circuit device associated with the second single crystal silicon layer.

21. The method of claim 20 wherein the first percentage of silicon 28 is less than 93 percent, and the second percentage of silicon 28 is greater than 95 percent.

22. The method of claim 20 further comprising forming a third single crystal silicon layer between the first single crystal silicon layer and the superlattice and having a third percentage of silicon 28 higher than the first percentage of silicon 28.

23. The method of claim 20 further comprising forming a third single crystal silicon layer between the superlattice and the second single crystal silicon layer.

24. The method of claim 20 wherein the superlattice comprises a first superlattice above the first single crystal silicon layer; and further comprising:

forming a third single crystal silicon layer above the first superlattice; and forming a second superlattice above the third single crystal silicon layer and below the second single crystal silicon layer.

25. The method of claim 20 wherein the superlattice is on the first single crystal silicon layer, and the second single crystal silicon layer is on the superlattice.

26. The method of claim 20 wherein the at least one circuit device comprises a plurality of quantum bit devices.

27. The method of claim 20 wherein forming the at least one circuit device comprises:

forming spaced apart source and drain regions in the second single crystal silicon layer defining a channel therebetween; and forming a gate comprising a gate dielectric layer overlying the channel and a gate electrode overlying the gate dielectric layer.

* * * * *